United States Patent
Nasser-Ghodsi et al.

[11] Patent Number: 5,907,158
[45] Date of Patent: May 25, 1999

[54] BROAD RANGE ION IMPLANTER

[75] Inventors: Mehran Nasser-Ghodsi, Hamilton; Andrew Wittkower, Rockport, both of Mass.; Hilton F. Glavish, Incline Village, Nev.; Kenneth H. Purser, Lexington; Gaylord C. Noblitt, III, Boxford, both of Mass.

[73] Assignee: Ebara Corporation, Tokyo, Japan

[21] Appl. No.: 08/856,410

[22] Filed: May 14, 1997

[51] Int. Cl.⁶ .................................................. H01J 37/147
[52] U.S. Cl. .................................. 250/492.21; 250/423 R
[58] Field of Search ........................... 250/492.21, 423 R, 250/348

[56] References Cited

U.S. PATENT DOCUMENTS

| | | | |
|---|---|---|---|
| 5,003,183 | 3/1991 | Nogami et al. | |
| 5,196,706 | 3/1993 | Keller et al. | 250/492.21 |
| 5,315,118 | 5/1994 | Mous | 250/492.21 |
| 5,399,871 | 3/1995 | Ito et al. | |
| 5,483,077 | 1/1996 | Glavish | 250/492.21 |

*Primary Examiner*—Kiet T. Nguyen
*Attorney, Agent, or Firm*—Choate, Hall & Stewart

[57] ABSTRACT

Ion implanter having at least two independent ion generating systems coupled to a single scanning end station. In a preferred embodiment one of the ion generating systems generates ions approximately in the 3–80 keV range and the other system generates ions approximately in the 80–3,000 keV range. The scanning end station may be employ magnetic, electrostatic, or mechanical scanning. This invention has particular relevance for the controlled doping of semiconducting materials and flat panel displays units in which doping may be needed for the production of microelectronic devices, the sub-circuit crystal damage that is useful for gettering unwanted impurity atoms and for the development of etch pits in flat panel displays. The disclosed apparatus makes possible a variety of chained implants at different energies using the same mask.

8 Claims, 1 Drawing Sheet

BROAD RANGE ION IMPLANTER

BACKGROUND OF THE INVENTION

This invention relates to the controlled ion implantation doping and etch enhancement of semiconductor materials and flat panel displays by bombardment with selected species of ions having energies in the range 1 keV to 3 MeV.

The development of microelectronics, together with their integrated circuit offsprings, (IC's), represents a major contribution to the revolution that is overtaking societies around the world. Even in their simplest forms, IC's have applications that are so diverse that it is impossible to provide a complete catalogue. Today, even the simplest mechanical devices, such as cooking stoves and washing machines, often include one or more IC's that provide capabilities that were unimaginable just a few decades ago. One impressive example is the hand-held Global Positioning System units (GPS) that provide, at very low cost, latitude and longitude position with an accuracy of a few meters anywhere on the earth.

There are two fundamental exponential "laws" of microelectronics underlying IC manufacture which have been obeyed for at least 30 years. The first is the observation that the transistor density on a silicon chip has grown geometrically for thirty years, doubling every 1½ years. The second is the "economic miracle" of the decreasing cost per bit of memory devices. The driving potential for this expansion is an outgrowth of two imperatives: One is higher speed, and the second is cost. As a consequence the basic trend is towards ever smaller devices and this trend is expected to dominate the industry for at least another decade.

One of the core manufacturing technologies that has made this scaling of microelectronics practical is the process of ion implantation. Implantation makes possible the creation of three-dimensional electrical circuits and switches with great precision and reproducibility. Ion implantation operates by modifying the electrical properties of well-defined regions of a silicon wafer by introducing selected impurity atoms, one by one, at a velocity that allows them to penetrate the surface layers and come to rest at an appropriate depth.

The characteristics which make implantation such a valuable processing procedure are threefold: First, the concentration of the introduced dopant atoms can be accurately controlled by a straightforward measurement of electrical charge. Secondly, the regions of the base material where dopant atoms are inserted can be precisely defined by photo-resist masks, making possible accurate patterning at ambient room temperature. Thirdly, the implant depth can be adjusted by varying the ion energy.

Presently, implanters are produced in several application specific models and a large semiconductor fabrication site will have several of each type. The types include:

1. High Current Implanters: Typically used for doping at concentration levels >1E15/$cm^2$ over the energy range 3–80 keV. (These implanters can be used for doses lower than 1E15 and energies higher than 80 keV.) As the name implies, high current capability (10–20 mA) is an essential characteristic for achieving these high dosings at economical throughputs. As feature sizes decrease the lower energy limit of high current implanters is expected to reduce to 1 keV or below; this may require the development of specialized tools. It is anticipated that by the year 2002 approximately 30% of all implants will fall into the high current category. Currently, a majority of commercially available high current implanters operate in the batch-wafer mode but customer pressures are likely to cause the introduction of serial models.

2. Medium Current Implanters: Typically used for doping at concentration levels <2E14/$cm^2$ over the energy range 20–200 keV. Some applications, such as threshold adjustment, require very high precision. Other recent applications require implanting ions at very large angles to the normal (45–60 degrees) and that this angle be variable during the implantation process. It is anticipated that by the year 2002 approximately 60% of all implants will fall into what is now considered the 'medium current class.' Presently medium current implanters are supplied as both serial and batch-wafer devices but serial tools will almost certainly dominate by 2002.

3. High Energy Implanters: Typically used for doping at concentration levels <3E13/$cm^2$ over the energy range 200–2300 keV. As circuit feature-sizes decrease and the separations between components become smaller the demands for high energy implantation is expected to substantially increase. It is anticipated that by the year 2002 between 5–10% of all implants will be high energy. Currently, both commercially available high energy implanters operate in the batch-wafer mode but customer pressure are likely to push for the introduction of serial tools.

The typical size of the largest versions of these machines is substantial (6 meters×3.5 meters) and occupy a significant area of clean room floor space, the annual costs of which may be as high as $50,000/square meter. Thus, while the above mix of implanter models has been accepted by industry there are growing pressures for the development of implanters that have smaller footprints, lower power consumption and that can carry out a very wide range of implantation steps, to allow chained implants, without removing the wafer being processed from the implanter.

There is also a trend in the semiconductor industry to move away from batch processing, where multiple wafers are processed simultaneously, to the processing of individual wafers. To achieve single wafer processing, an implantation apparatus often employs 'hybrid scanning.' Here, the ion beam is rastered at high frequency in one direction, using triangular shaped deflection voltage or magnetic field waveforms, and the wafer being processed is implanted by moving it underneath this beam (which may be a "ribbon beam") at a speed that is appropriate to introduce the necessary dopant concentration.

SUMMARY OF THE INVENTION

The present invention addresses the above-noted implanter requirements and describes a compact, low cost, broad range implanter capable of producing and implanting ions from keV energies to MeV energies. While batch processing is not excluded, in a preferred embodiment single wafer processing is the preferred mode and this is achieved by employing hybrid magnetic scanning. Compactness is achieved by arranging that ions having energies in the range of approximately 3–80 keV are produced from one source and ions having energies in the range of approximately 100 keV to several MeV are produced by a second. The outputs from the two sources are arranged that either one or the other can be directed into the magnetic scanning system.

In one aspect, the i on implanter of the invention includes at least two independent ion generating systems coupled to a single scanning end station. The end station may employ magnetic scanning, electrostatic scanning, or mechanical scanning. In a preferred embodiment, one of the at least two independent ion generating systems produces ions having energies in the range of approximately 3–80 keV and the other of the independent ion generating systems generates ions having energies in the range of approximately 100 keV to several MeV. Because the ion generating systems are independent, ion species and energies are easily selected. Ion species and energies may be changed without removing a wafer from its vacuum environment. The implanter of the invention is very compact and can accommodate multiple ion species over a very large energy range at a significant cost savings as compared to the prior art.

DESCRIPTION OF THE PREFERRED EMBODIMENT

Figure 1:
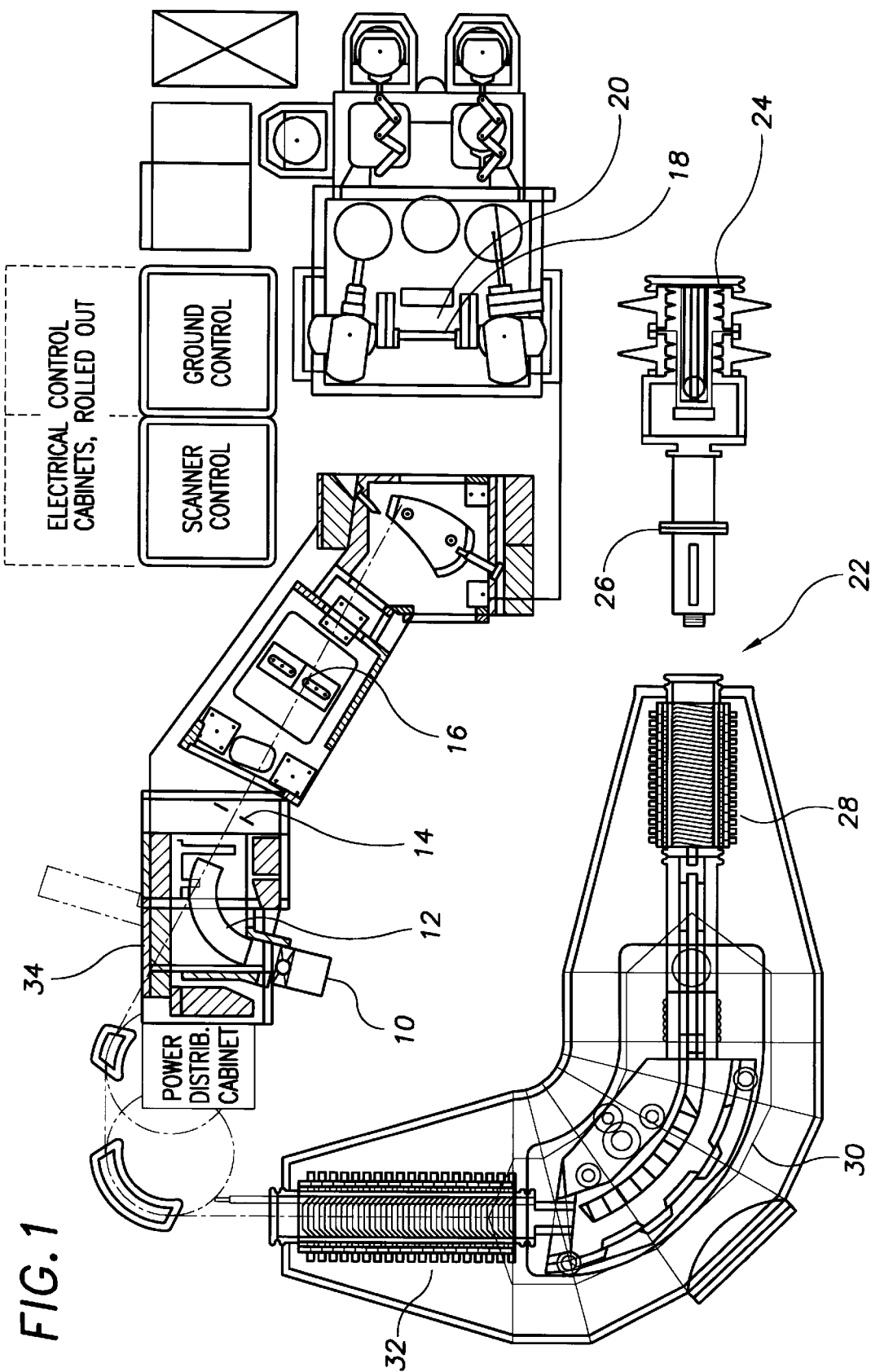
FIG. 1, the single FIGURE of the drawing, is a cross-sectional, schematic illustration of the implanter of the invention in which multiply sources of high velocity of ions can be directed into a single wafer handling system.

With reference first to FIG. 1, a first ion source 10 generates positive ions of a desired dopant species in the energy range of 3–100 keV. Suitable ion species include boron and phosphorous. A mass analyzer 12 selects appropriate ions which are accelerated and those ions having an unwanted mass are rejected at a defining aperture 14. Desired ion species enter a magnetic scanner 16. A suitable magnetic scanner 16 has been described by Glavish in U.S. Pat. Nos. 5,311,028; 5,393,984; 5,483,077; and 5,481,116. The magnetic scanner 16 displaces ions in a linear manner so that at an implantation position 18 the desired ion species forms a uniform curtain of particles under which a wafer 20 being implanted passes.

A second ion generating system 22 provides ions in the energy range of approximately 80–3,000 keV as described by K. H. Purser in U.S. patent application Ser. No. 08/804, 337 filed Dec. 24, 1996. As described in that patent application, the ion generating system 22 includes a suitable ion source 24 and an appropriate acceleration gap 26. After production, the ions pass through an acceleration stage 28 and then into an electrostatic or magnetic deflector 30 in which ions having a desired charge state are deflected through an angle such as ninety degrees as shown in the FIGURE. The ions then travel through a second acceleration stage 32. The beam is turned further and enters a second ion entry point 34.

It will be recognized by those skilled in the art that other types of MeV acceleration systems may be employed to provide the necessary high energy ions. Such alternative systems might include, without limitation, tandem accelerators such as those that have been described by Turner, Purser and Sieradski in *Nuclear Instruments and Methods* Volume B21, pages 285–295 (1987) or Linac type accelerators, similar to those described by Glavish in *Nuclear Instruments and Methods* Volume B21, pages 264–269 (1987). Generally all of these high energy acceleration systems provide a beam of high energy charged particles that have a diameter of a few centimeters or less and will have angular inhomogeneities of a few 10's of milliradians.

Those skilled in the art will appreciate that there are many ways in which the direction of the beam of high energy particles can be changed. These ways include homogeneous or non-homogeneous magnetic and electric fields or combinations of the two. Such devices have been discussed in detail in the book "Focusing of Charged Particles" edited by Albert Septier, Academic Press (1967). Regardless of the particular components used for directing the high energy ion beam, the ions must be directed such that they pass through the defining aperture 14 with a central ray of the high energy ion beam traveling along the center line at the entrance to the magnetic scanner 16.

In operation, when it is desired to implant ion species in the 3–80 keV range, the ion source 10 is activated which delivers the appropriate ions to a wafer 20 which is contained in a conventional scanning end station. A suitable end station may employ magnetic scanning, electrostatic scanning, or mechanical scanning. When higher energy ionic species are desired, the second ion generating system 22 is activated which will deliver ions in the energy range of approximately 80–3,000 keV for implantation into the wafer 20. Switch over from one energy regime to the other does not require removal of the wafer 20 from its high vacuum environment in the implanter.

It will be appreciated by those skilled in the art that the present invention may be used in conjunction with the controlled doping of semiconducting materials and flat panel display units. Because the disclosed system uses two independent ion generating systems, the overall apparatus is quite compact and obviates multiple machines as known in the prior art. It is recognized that modifications and variations of the invention and the embodiment set forth herein will occur to those skilled in the art and it is intended that all such modifications and variations be included within the scope of the appended claims.

What is claimed is:

1. Ion implanter comprising a first ion generating system for implanting ions having energies of approximately 3–80 keV, and a second ion generating system for implanting ions having energies of approximately 80–3,000 keV, the first and second ion generating systems coupled to a single scanning end station.

2. The ion implanter of claim 1 wherein the scanning end station employs magnetic scanning.

3. The ion implanter of claim 1 wherein the scanning end station employs electrostatic scanning.

4. The ion implanter of claim 1 wherein the scanning end station employs mechanical scanning.

5. The ion implanter of claim 1 wherein one of the two independent ion generating systems employs at least one tandem accelerator.

6. The ion implanter of claim 1 wherein one of the ion generating systems employs at least one linac-type accelerator.

7. The ion implanter of claim 1 wherein the implanter can simultaneously implant ions in multiple wafers.

8. The ion implanter of claim 1 utilizing a neutral beam accelerator.

* * * * *